US006504230B2

United States Patent
Deboy et al.

(10) Patent No.: US 6,504,230 B2
(45) Date of Patent: Jan. 7, 2003

(54) COMPENSATION COMPONENT AND METHOD FOR FABRICATING THE COMPENSATION COMPONENT

(75) Inventors: Gerald Deboy, München (DE); Hans-Joachim Schulze, Ottobrunn (DE); Anton Mauder, Kolbermoor (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/093,306

(22) Filed: Mar. 7, 2002

(65) Prior Publication Data

US 2002/0123188 A1 Sep. 5, 2002

Related U.S. Application Data

(63) Continuation of application No. PCT/EP00/08707, filed on Sep. 6, 2000.

(30) Foreign Application Priority Data

Sep. 7, 1999 (DE) .......................... 199 42 677

(51) Int. Cl.[7] .............................................. H01L 29/00
(52) U.S. Cl. ...................... 257/547; 257/549; 257/550
(58) Field of Search ................................ 257/547, 549, 257/550, 342, 341, 329

(56) References Cited

U.S. PATENT DOCUMENTS

| 5,712,502 A | * | 1/1998 | Mitlehner et al. ........... 257/341 |
| 5,767,533 A | * | 6/1998 | Vydyanath ................... 257/101 |
| 6,184,555 B1 | * | 2/2001 | Tihanyi et al. ............... 257/329 |
| 6,239,463 B1 | * | 5/2001 | Williams et al. ............. 257/328 |
| 2001/0040254 A1 | * | 11/2001 | Takiguchi .................... 257/520 |

FOREIGN PATENT DOCUMENTS

| DE | 196 04 043 A1 | 8/1997 |
| EP | 0 760 528 A2 | 3/1997 |
| EP | 0 915 521 A2 | 5/1999 |

OTHER PUBLICATIONS

G. Deboy et al.: "A new generation of high voltage MOS-FETs breaks the limit line of silicon", IEDM–98, pp. 683–685.

* cited by examiner

Primary Examiner—Olik Chaudhuri
Assistant Examiner—William C. Vesperman
(74) Attorney, Agent, or Firm—Laurence A. Greenberg; Werner H. Stemer; Ralph E. Locher

(57) ABSTRACT

A compensating component and a method for the production thereof are described. Compensating regions are produced by implanting sulfur or selenium in a p-conductive semi-conductor layer or, are provided as p-conductive regions, which are doped with indium, thallium and/or palladium, in a cluster-like manner inside an n-conductive region.

5 Claims, 2 Drawing Sheets

COMPENSATION COMPONENT AND METHOD FOR FABRICATING THE COMPENSATION COMPONENT

CROSS-REFERENCE TO RELATED APPLICATION

This application is a continuation of copending International Application PCT/EP00/08707, filed Sep. 6, 2000, which designated the United States.

BACKGROUND OF THE INVENTION

Field of the Invention

The present invention relates to a compensation component and to a method for fabricating it.

As is known, the on-state losses in metal-oxide semiconductor (MOS) transistors are composed of losses in the channel between a source zone and a drain zone and of resistive losses in the drift region that serves for taking up a space charge zone in an off-state situation of the MOS transistor. In high-voltage MOS transistors, the proportion of the resistive losses that is caused by the drift region is actually the proportion that is particularly high and dominant.

In order to reduce the resistive losses in the drift region in high-voltage MOS transistors, compensation components were developed. In the case of the latter, highly n-conducting regions and highly p-conducting regions are situated next to one another in the vertical direction in the drift region. For this purpose, by way of example, pillar-type highly p-doped regions are introduced into a highly n-doped semiconductor body. In this case, the net doping is virtually compensated averaged over the drift region horizontally. In other words, in the above example, the doping of the p-doped pillar-type regions practically compensates for the doping of the n-conducting semiconductor body.

If a reverse voltage is applied to the compensation component, then a significant part of the opposite charge of the ionized dopant atoms is situated in the same horizontal plane, so that the electric field strength is reduced little in the vertical direction between the two main surfaces of the semiconductor body. In other words, only a small resultant gradient of the electric field strength is present here in the vertical direction. Therefore, in the vertical direction, the reverse voltage can be dissipated over a smaller thickness of the drift region of the compensation component.

However, since a higher effective n-type doping is available in the drift region in the on-state situation, the compensation components are distinguished by drastically lower losses in the on state in comparison with conventional MOS transistors equal in area. Compensation components thus have a considerably reduced on resistance.

Compensation components are complicated to fabricate, due to the alternating structure of the p-conducting and n-conducting regions in the drift region, that is to say due to an alternating p/n/p/n . . . structure in the lateral direction.

In the prior art there are two different methods for fabricating such alternating p/n/p/n . . . structures of the compensation components.

In the preferred method, multistage epitaxy processes with interposed implantations are employed. In specific terms, in this case n-conducting epitaxial layers are applied to an $n^+$-conducting silicon substrate, and each epitaxy process is followed by an implantation of boron atoms at locations lying one above the other, with the result that, in the event of a subsequent thermal treatment, the boron implantations lying one above the other form a pillar-type p-conducting region in an n-conducting region.

In the other customary method, deep trenches are introduced into a silicon body of one conductivity type and are subsequently filled with silicon of the other conductivity type.

What is common to both known methods is that they require, for every chip size in a desired voltage class, an exactly adapted substructure in the silicon of the drift region and their processing is extremely complicated and hence expensive.

Despite this considerable disadvantage of complicated processing and a high outlay, no thought has been given heretofore to configuring a compensation component and also a method for fabricating it in a different way such that these disadvantages can be overcome.

SUMMARY OF THE INVENTION

It is accordingly an object of the invention to provide a compensation component and a method for fabricating it which overcome the above-mentioned disadvantages of the prior art devices and methods of this general type, in which complicated and expensive processing can be dispensed with.

With the foregoing and other objects in view there is provided, in accordance with the invention, a compensation component. The compensation component contains a semiconductor body made of silicon, an n-conducting drift zone formed in the semiconductor body, and a p-conducting dopant introduced into the n-conducting drift zone. The p-conducting dopant forms cluster-shaped regions in the n-conducting drift zone and is selected such that a first gap between an acceptor level and a valence band edge is greater than a second gap between a donor level and a conduction band edge.

What is essential to the present invention is the basic idea either of introducing into the usually n-conducting basic doping of the drift zone homogeneously distributed p-conducting atoms with about the same doping concentration as the n-conducting basic doping or else of departing from the concept of an n-conducting basic body and introducing into a p-conducting silicon body a relatively rapidly diffusing dopant with donor properties, such as, in particular, sulfur and/or selenium, in order thus to produce the desired n-conducting pillar-type regions with the rapidly diffusing dopant.

The text below will first discuss the first alternative, that is to say the homogeneous distribution of atoms of one conductivity type in a basic doping of the other conductivity type of the drift region. Although the text below explains in detail how p-doping or p-conducting atoms, namely in particular indium atoms, thallium atoms and palladium atoms, are introduced into a customary n-conducting doping of a drift zone made of phosphorus, for example, the conductivity types can also be reversed, if appropriate, given corresponding selection of the atoms. The same also applies, of course, to the second method explained in more detail further below.

In the selection of the dopant for the first method, that is to say for the introduction of p-doping atoms into a customary n-type doping of the drift zone, care must be taken to ensure that the gap between the acceptor energy level and the valence band edge of silicon is larger than about 150 meV, so that only a very small proportion of the acceptor atoms are ionized at room temperature in thermal equilibrium. In the forward direction of the compensation component, only a small proportion of the n-conducting doping of the drift region is thus compensated, so that the compensation component, in particular a transistor, has the desired low on-state losses.

Moreover, the gap between the acceptor level and the valence band edge should be larger than the gap between the donor level and the conduction band edge of silicon. This is because in the off-state situation a space charge zone is built up which has the effect that the holes liberated during the ionization of the acceptors immediately blow away and cannot interact with other acceptor rumps. Thus, all the acceptors are then ionized in a short time, so that the donors are compensated in the volume of the drift region. In other words, the conditions prevailing are similar to those in customary compensation components.

An essential advantage of the first method resides in a particularly simple and hence inexpensive process control in comparison with the prior art with epitaxy processes and implantations or deep trenches. The p-conducting dopant, that is to say in particular indium, thallium and palladium, can readily be produced at the same time as the n-type doping during the deposition of the epitaxial layer, so that the implantations can be obviated. In addition, an epitaxial wafer treated in this way can be used as a basic material for all chip sizes of a voltage class, which considerably simplifies the logistics and allows the turnaround times to be shortened. This is because it is possible, during the deposition process for the epitaxial layers, to alter the dopant composition by way of the thickness of the epitaxial layers and thus to set the component properties accordingly.

As an alternative to the deposition of an epitaxial layer doped with indium, thallium or palladium, it is possible for the p-type doping to be introduced before the start of a front side processing in a customary manner or to be indiffused during the process through openings in corresponding windows.

In this case, it is of importance that the p-conducting dopant forms clusters that are at different locations from the n-conducting doping of the drift region. This is intended to prevent a direct transition of electrons from the donor level to the acceptor level, while compensation of the charge carriers is still achieved in a plane over a relatively large area.

In the compensation component according to the invention, the edge termination should be n-loaded, which can be achieved by corresponding doping with selenium, for example. The advantage of the donor material is that it likewise has a plurality of deep energy levels, such as, for example, a deep energy level with a gap of about 310 meV relative to the conduction band edge. As a result, a similar time delay is achieved during the build up of the space charge zone and reverse voltage as in a homogeneous semiconductor material, which has a favorable effect on the turn-off properties of a transistor and the stability of the edge thereof.

In the second method, which will be discussed in more detail below, sulfur and selenium are introduced into silicon wafers by diffusion, since these diffuse relatively quickly there, so that it is possible to realize a doping in a specific wafer depth with a relatively low temperature/time loading on the wafers.

Sulfur atoms and selenium atoms can be indiffused into the silicon wafers for example by a masked implantation with a subsequent drive-in step. The doping concentration of n-conducting regions can then readily be controlled by the dose of the sulfur and selenium implantation, respectively, the drive-in temperature and the drive-in time. Silicon dioxide or photoresist layers having a sufficient thickness can be used in a customary manner as masking layers for the implantation of sulfur or selenium. It has been shown that a thickness of about 1 $\mu$m is sufficient.

By virtue of the significantly shorter diffusion time of sulfur and selenium compared with a boron diffusion, the number of epitaxial layers required can be reduced, which entails a significant reduction of costs.

The doping concentration in the p-conducting regions can be delimited particularly well, since, after all, a p-conducting basic material is preferably used as a starting point.

In the n-conducting pillar-like regions, it is possible, if appropriate, to perform a vertical variation of the degree of compensation if, for example, two different n-doping implantation planes are employed or the concentration of the n-conducting dopant is altered during the deposition of the epitaxial layer.

A special property of silicon layers doped with sulfur and/or selenium is that the effective doping concentration of such silicon layers rises with temperature, since sulfur and selenium as doping materials have energy levels lying deep in the silicon band gap. As a result, in the forward state of the component, more and more free charge carriers are made available as the temperature increases. However, since the mobility of the free charge carriers decreases as the temperature increases, the dependence of the on resistance on the temperature is thus reduced. In contrast, in the reverse state, in which the sulfur atoms and/or selenium atoms are situated in the space charge zone, these are completely activated.

Other features which are considered as characteristic for the invention are set forth in the appended claims.

Although the invention is illustrated and described herein as embodied in a compensation component and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
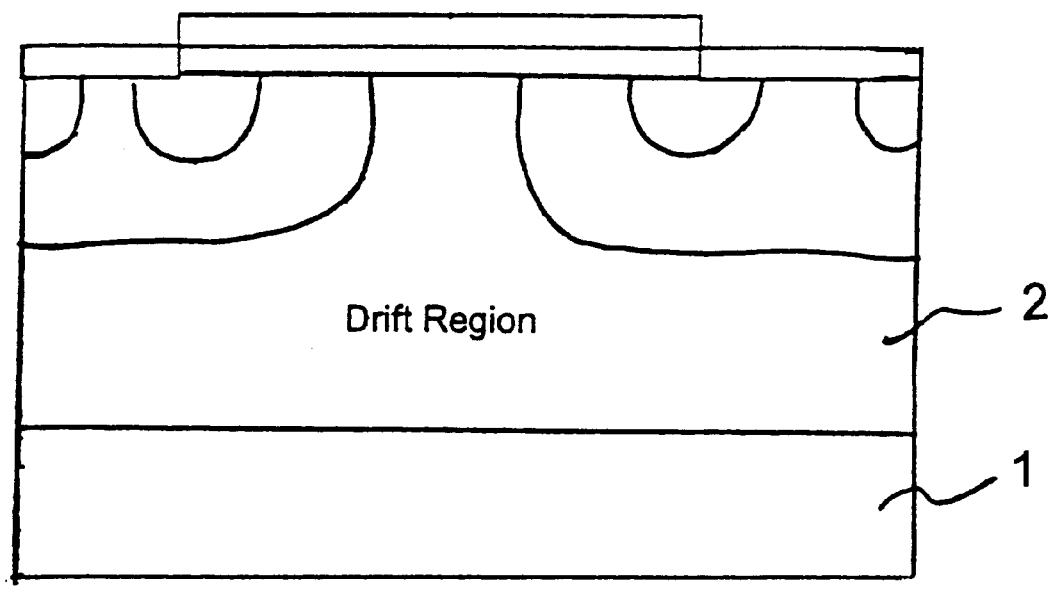
FIG. 1A is a diagrammatic, sectional view of a generic MOS transistor having a drift region.
Figure 1B:
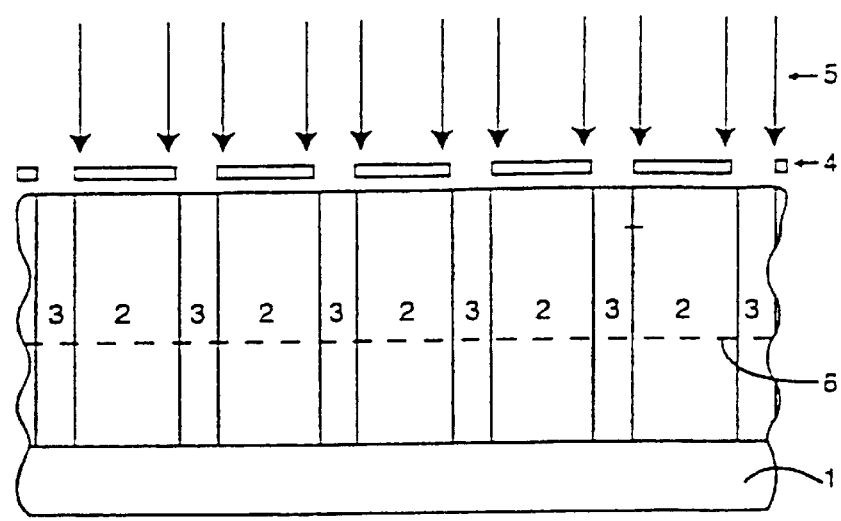
FIG. 1B is a diagrammatic, sectional view elucidating an exemplary embodiment in which sulfur or selenium is introduced by implantation into a semiconductor body in order to produce in the latter compensation regions for fabricating a drift region for a compensation component according to the invention.

Referring now to the figures of the drawing in detail and first, particularly, to FIG. 1A thereof, there is shown a drift region of a compensation component, such as, for example, a MOS transistor with a p+-conducting silicon substrate 1, on which a p-conducting silicon layer 2 is applied by of one or more epitaxy processes, for example. FIG. 1A shows a generic transistor and the invention is not limited to this embodiment of the MOS transistor as the emphasis of the invention is on the compensation component in the drift region which can be used in various MOS transistor configurations. FIG. 1B shows that through a diffusion of sulfur and/or selenium, n-conducting pillar-type regions 3 are introduced into the layer 2, which constitutes a p-conducting region. The pillar-type regions 3 are doped so highly that a net doping is virtually compensated averaged horizontally, that is to say perpendicularly to the course of the regions 3.

This can be done for example by a masked ion implantation (see arrows 5) with the aid of a mask 4 made of silicon dioxide or photoresist and having a thickness of about 1 μm. The doping concentration in the n-conducting regions 3 produced in this way can then be controlled by way of the dose of the sulfur and/or selenium implantation, the drive-in temperature during the subsequent thermal step and the drive-in time thereof.

Since sulfur and selenium diffuse relatively quickly in silicon, it is possible in this way to fabricate the drift region of a compensation component without complicated and numerous epitaxy and implantation steps, which results in a significant reduction of costs.

A vertical variation of the degree of compensation can be achieved by providing, for example, an additional implantation plane (see dashed line 6). In a first epitaxy step, the layer 2 is grown up to the height of the dashed line 6 on the silicon substrate 1. There then follows a first implantation, in order that, for example, lower parts of the regions 3 are thus doped more highly than upper parts thereof. The configuration illustrated in FIG. 1B is then completed with a further epitaxy and implantation step, in association with a drive-in step at the end of the epitaxial deposition.

Figure 2:
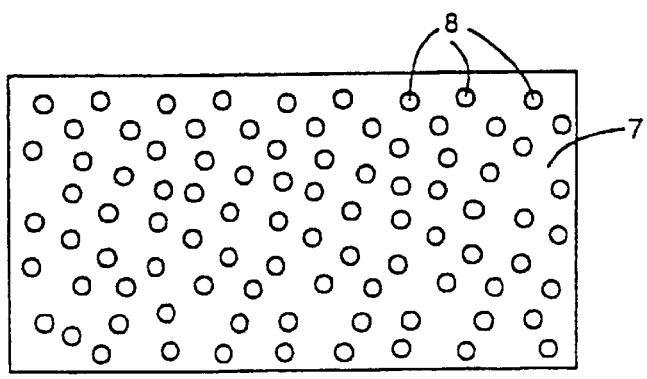
FIG. 2 is a diagrammatic illustration of a p-type doping formed by clusters and containing, for example, indium, thallium or palladium in an n-conducting region of a drift region.
Figure 3:
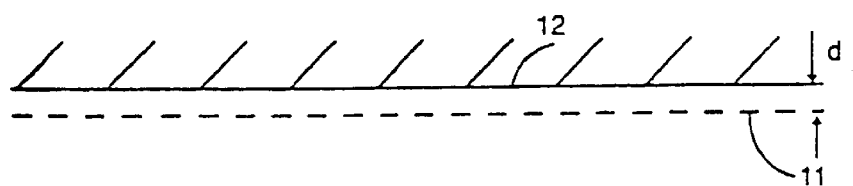
FIGS. 3 and 4 are band illustrations for elucidating the doping according to the example shown in FIG. 2.
Figure 4:
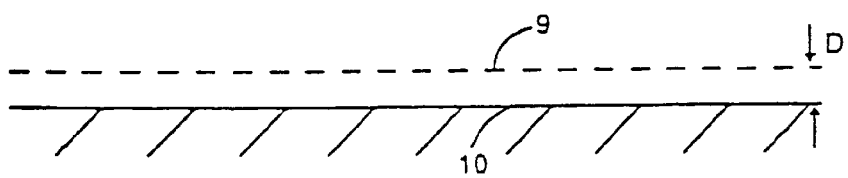
Figure 4:
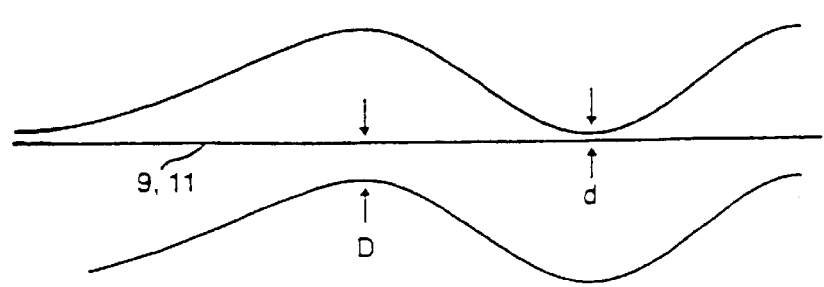

Whereas defined n-conducting and p-conducting regions are present in the drift region in the exemplary embodiment of FIG. 1B (second method), this does not apply to the exemplary embodiment of FIGS. 2 to 4 (first method). In that case, cluster-like p-conducting regions 8 with acceptor atoms containing indium, thallium and/or palladium are incorporated into an n-conducting region 7 (see FIG. 2). The p-conducting regions 8 in the n-conducting region 7 with, for example, phosphorus donor atoms are doped so highly that, as in the exemplary embodiment of FIG. 1B, the net doping is virtually compensated averaged horizontally over the drift region.

The p-type doping for the regions 8 can be produced practically at the same time as the n-type doping of the region 7 during the deposition of a corresponding epitaxial layer. In other words, if an epitaxial layer is applied to a silicon substrate, such as, for example, the silicon substrate 1 of FIG. 1B, then the deposition is performed in such a way that the epitaxial layer formed thereby with the n-conducting phosphorus basic doping grows with the cluster-like regions 8 incorporated therein, the regions being doped with indium, thallium or palladium.

Instead of indium, thallium and palladium, it is also possible, if appropriate, to choose other materials. What is essential, however, is that a gap D (see FIG. 3) between an acceptor energy level 9 and a valence band edge 10 of the silicon is larger than 150 meV and is also larger than a gap d between a donor level 11 and a conduction band edge 12. In this case, care should be taken to ensure that the corresponding energy levels are locally offset from one another, as is indicated diagrammatically in FIG. 4, in order to avoid a direct transition between the levels. Given a locally simultaneous occurrence of n-conducting and p-conducting doping on the microscopic scale, a homogeneous compensation is thus present with a corresponding absence of highly n-conducting zones with increased electrical conductivity. In other words, whereas n-conducting and p-conducting regions are separated microscopically, macroscopically, that is to say relative to the scale of the breakdown charge, there is a homogeneous charge distribution with a possibly superposed gradient in the sense of a variable pillar concept.

We claim:

1. A compensation component, comprising:

a semiconductor body made of silicon;

an n-conducting drift zone formed in said semiconductor body; and a p-conducting dopant introduced into said n-conducting drift zone, said p-conducting dopant forming cluster-shaped regions in said n-conducting drift zone and selected such that a first gap between an acceptor level and a valence band edge being greater than a second gap between a donor level and a conduction band edge.

2. The compensation component according to claim 1, wherein said second gap between said donor level and said conduction band edge exceeds 150 meV.

3. The compensation component according to claim 1, wherein said n-conducting drift zone has an n-conducting doping and said cluster-shaped regions are at different locations from said n-conducting doping of said n-conducting drift zone.

4. The compensation component according to claim 1, wherein said p-conducting dopant contains at least one element selected from the group consisting of indium, thallium and palladium.

5. The compensation component according to claim 1, wherein said n-conducting drift zone is doped with phosphorus.

* * * * *